(12) United States Patent
Lichtinger

(10) Patent No.: US 6,927,969 B2
(45) Date of Patent: Aug. 9, 2005

(54) CIRCUIT ARRANGEMENT

(75) Inventor: Bernhard Lichtinger, Sünching (DE)

(73) Assignee: Siemens Aktiengesellschaft, Munich (DE)

( * ) Notice: Subject to any disclaimer, the term of this patent is extended or adjusted under 35 U.S.C. 154(b) by 41 days.

(21) Appl. No.: 10/649,962

(22) Filed: Aug. 27, 2003

(65) Prior Publication Data

US 2004/0159937 A1 Aug. 19, 2004

Related U.S. Application Data

(63) Continuation of application No. PCT/DE02/00717, filed on Feb. 27, 2002.

(30) Foreign Application Priority Data

Feb. 27, 2001 (DE) ......................... 101 09 344

(51) Int. Cl.$^7$ ................................ H05K 5/00
(52) U.S. Cl. ................ 361/679; 361/820; 257/723; 257/724
(58) Field of Search ................ 257/700, 723, 257/724, 786; 361/679, 820

(56) References Cited

U.S. PATENT DOCUMENTS

| | | | | |
|---|---|---|---|---|
| 3,971,062 A | | 7/1976 | Merkle | ......................... 357/70 |
| 4,241,360 A | | 12/1980 | Hambor et al. | ................ 357/56 |
| 5,994,768 A | * | 11/1999 | Fogelson | ..................... 257/666 |
| 6,021,048 A | * | 2/2000 | Smith | ......................... 361/736 |
| 6,031,278 A | * | 2/2000 | Onoda et al. | ................ 257/649 |
| 6,049,975 A | * | 4/2000 | Clayton | ....................... 29/832 |
| 6,121,681 A | * | 9/2000 | Tanaka et al. | ............... 257/723 |
| 6,707,673 B2 | * | 3/2004 | Duesman et al. | ........... 361/704 |
| 6,737,741 B2 | * | 5/2004 | Imasu et al. | ................ 257/723 |

* cited by examiner

Primary Examiner—Tom Thomas
Assistant Examiner—N. Drew Richards
(74) Attorney, Agent, or Firm—Baker Botts L.L.P.

(57) ABSTRACT

First and second chips each having a transistor are provided. The first chips are arranged along a first axis on a first metallic body in side-by-side and interspaced manner. The second chips are arranged parallel to the first axis on a second metallic body in a side-by-side and interspaced manner. The second chips are arranged perpendicular to the first axis opposite an area of the first body and are each connected to the opposite area via at least one bonding connection. The first chips, with regard to the third axis, are arranged opposite an area of the second body, which is located between adjacent second chips. A third metallic body is arranged on the second body and comprises projections each of which being arranged on one of the areas of the second body. The first chips are each connected to the opposite projection via at least one bonding connection.

16 Claims, 1 Drawing Sheet

CIRCUIT ARRANGEMENT

CROSS REFERENCE TO RELATED APPLICATION

This application is a continuation of copending International Application No. PCT/DE02/00717 filed Feb. 27, 2002 and claiming a priority date of Feb. 27, 2001, which designates the United States.

TECHNICAL FIELD OF THE INVENTION

The invention relates to a circuit arrangement having a parallel circuit comprising a plurality of half bridges.

BACKGROUND OF THE INVENTION

In such a circuit arrangement, first transistors are connected in parallel between a ground terminal and an output terminal, while second transistors are connected in parallel between the output terminal and a voltage terminal. In each case, a first transistor and a second transistor form a half bridge. The half bridges are therefore connected in parallel between the ground terminal and voltage terminal.

The fabrication of circuit arrangements in hybrid technology is known. To this end, chips having semi-conductor devices without chip packaging are electrically contacted and mounted directly on a ceramic carrier, in which conducting paths are arranged. Further electrical lines for the chip are created via bonding connections.

The aim is to produce circuit arrangements with increasingly smaller space requirements, while making sure that bonding connections are not too long, so that their electrical resistance remains at a low level.

SUMMARY OF THE INVENTION

The object of the invention is to specify a circuit arrangement having a parallel circuit comprising a plurality of half bridges, which has lower space requirements and shorter bonding connections compared to the state of the art.

The object is achieved by means of a circuit arrangement having the following features: first chips of the circuit arrangement each contain a transistor and are arranged along a first axis on a first metallic body in a side-by-side and interspaced manner. The first chips are electrically connected to the first body. Second chips of the circuit arrangement each contain a transistor and are arranged along a second axis parallel to the first axis on a second metallic body in a side-by-side and interspaced manner. The second chips are electrically connected to the second body. The second chips, with regard to a third axis perpendicular to the first axis, are each arranged opposite an area of the first body, which is located between adjacent first chips. The second chips are each electrically connected to the corresponding opposite area of the first body via at least one bonding connection. The first chips, with regard to the third axis, are each arranged opposite an area of the second body, which is located between adjacent second chips. A third metallic body is arranged on the second body so that it is electrically insulated and has projections, each of which is arranged on one of the areas of the second body. The first chips are each electrically connected to the opposite projection of the third body via at least one bonding connection.

The first and second chips can be connected to an output terminal via the first body. The second chips can be connected to a voltage terminal via the second body. The first chips can be connected to a ground terminal via the third body. In each case, a first chip and a second chip form a half bridge. The half bridges are connected in parallel between the third body and second body.

The circuit arrangement has low space requirements thanks to the stacked arrangement of the second body and third body and to the fact that the chips are mounted on the bodies instead of next to the bodies, which act as electrical lines. The arrangement of the second chips offset against the first chips makes it possible to have very short bonding connections between the first body and second chips. At the same time, the projections of the third body make it possible to have very short bonding connections between the first chips and the third body.

Because of their short length, the bonding connections are not sensitive to vibrations, which means that the circuit arrangement is particularly suitable for mounting in a vibrating device, e.g. a starter generator of a vehicle. Also due to the short length of the bonding connections, only a few bonding connections are required to connect a chip to a body even for high currents, as shorter bonding connections have a lower electrical resistance. The fact that fewer bonding connections are needed helps reduce the amount of space required by the circuit arrangement.

For particularly high currents, it is advantageous to mount the first chips without packaging directly on the first body in such a way that an electrical contact between the first chips and first body is created. The electrical connection between the first chips and first body is thus achieved in that the first chips are mounted directly adjacent to the first body. No additional conducting paths or wires are needed, which would lead to an increase in electrical resistance. The bodies also act as an electrical line and as carriers. The bodies have a clearly larger cross-section perpendicular to the direction of current than conventional conducting paths arranged in an insulating carrier and are therefore suitable for very high currents.

The circuit arrangement has for example a first control line, which runs parallel to the first axis and is connected to the first chips via bonding connections. A second control line may be provided, which runs parallel to the first axis and is connected to the second chips via bonding connections. The gate electrodes of the transistors in the chips can be loaded with voltage via the control lines, thus enabling the transistors to be controlled.

The first body and second body can be in the form of patterned boards. For example, the first body can be in the form of a bar and the second body can be in the form of a rectangle.

The first chips are arranged along one edge of the body, which runs parallel to the first axis. The second chips are arranged along one edge of the second body, which runs parallel to the first axis. The edge of the first body and the edge of the second body are arranged side by side as close as possible to each other while ensuring that they are electrically insulated from each other, to reduce space requirements.

BRIEF DESCRIPTION OF THE DRAWINGS

An exemplary embodiment of the invention is described in more detail below using the figures.

DETAILED DESCRIPTION OF THE PREFERRED EMBODIMENTS

A circuit arrangement is provided in the exemplary embodiment, which shows a parallel circuit comprising half bridges.

Figure 1:
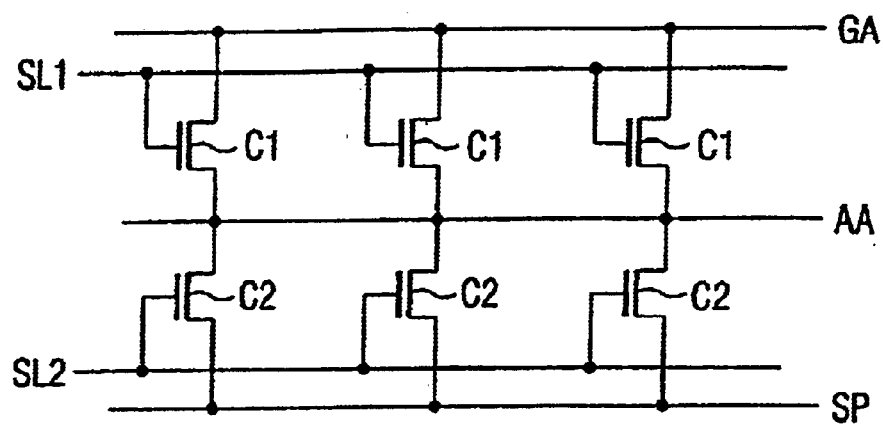
FIG. 1 shows the circuit diagram of a circuit arrangement having first chips, second chips, a ground terminal, an output terminal and a voltage terminal.
Figure 2:
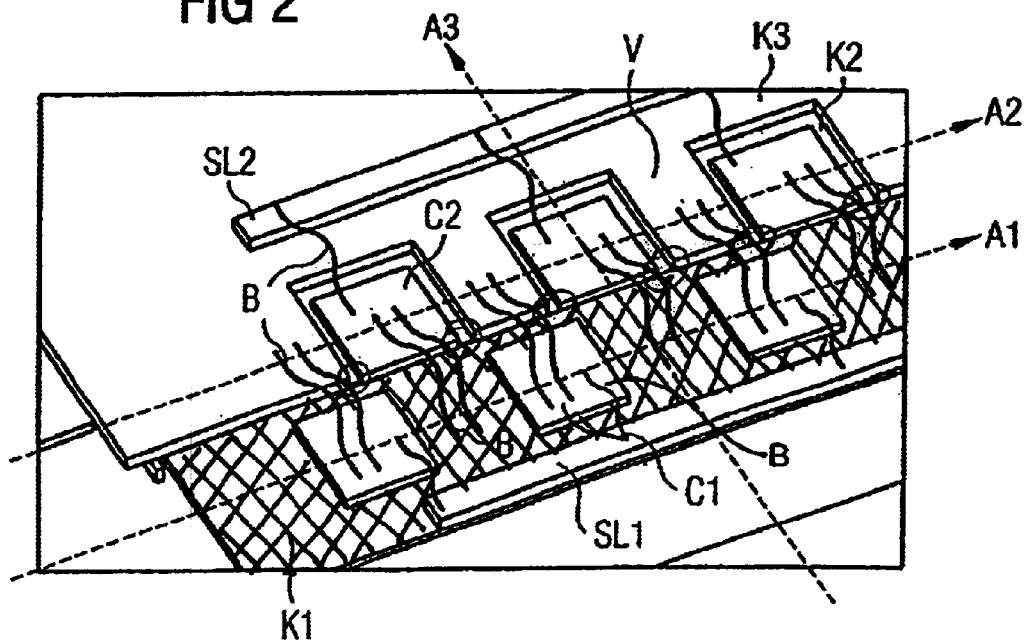
FIG. 2 shows a three-dimensional view of the circuit arrangement, in which the first chips, second chips, bonding connections, a first body, a second body, a third body, a first control line and a second control line can be seen.

First chips C1 of the circuit arrangement are mounted along a first axis A1 without packaging directly on a first metallic body K1, which is in the form of a bar and is essentially made out of copper (see FIG. 2). The first chips C1 each have a transistor. The first chips C1 are arranged on the first body K1 in such a way that first source/drain areas of the first chips C1 are electrically connected to the first body K1.

The first body K1 is approx. 2 mm thick and approx. 12 mm wide. The first chips C1 are approx. 10 mm long and are spaced approx. 12 mm apart from each other.

A first control line SL1 in the form of a bar is arranged on the first body K1 and electrically insulated from the first body K1. Gate electrodes of the transistors in the first chips C1 are electrically connected to the first control line SL1 via bonding connections (see FIG. 2).

The circuit arrangement has second chips C2, which are arranged in the same way as the first chips C1 and are mounted along a second axis A2 without packaging parallel to the first axis A1 directly on a second metallic body K2 in such a way that the first source/drain areas of the transistors in the second chips C2 are electrically connected to the second body K2. The second body K2 is essentially made of copper and is in the form of a rectangle.

The second body K2 and the first body K1 are arranged side by side. The second chips C2 are arranged along one edge of the second body K2, which is located opposite the first body K1 and runs parallel to the first body K1 (see FIG. 2). The second chips C2, with regard to a third axis A3 perpendicular to the first axis A1, are each arranged opposite an area of the first body K1, which is located between adjacent first chips C1. The second chips C2 are therefore offset diagonally to the first chips C1.

Second source/drain areas of the second chips C2 are connected to the corresponding opposite areas of the first body K1 via bonding connections B.

A third metallic body K3, which is essentially made of copper, is arranged on the second body K2 so that it is electrically insulated and comprises projections V, each of which being arranged on one of the areas of the second body K2, which are located between adjacent second chips C2. The third body K3 therefore has a crenellated outer edge (see FIG. 2).

Second source/drain areas of the transistors in the first chips C1 are connected to the projections V of the third body K3 via bonding connections B.

A second control line SL2 in the form of a bar is arranged on the third body K3 so that it is electrically insulated and runs parallel to the first axis A1. Gate electrodes of the transistors in the second chips C2 are connected to the second control line SL2 via bonding connections B.

All bonding connections B are a maximum of 12 mm long. The second source/drain areas of the transistors in chips C1, C2 are each contacted via two bonding connections B.

The first body K1 is connected to an output terminal AA. The second body K2 is connected to a voltage terminal SP, which is loaded with approx. 36 volts. The third body K3 is connected to a ground terminal GA, which is loaded with zero volts.

In each case, a first chip C1 and a second chip C2 form a half bridge in the circuit arrangement. The second chips C2 connected in parallel form a highside drive, while the first chips connected in parallel form a lowside drive.

What is claimed is:

1. Circuit arrangement comprising:
   first chips, which each contain a transistor and are arranged along a first axis on a first metallic body in a side-by-side and interspaced manner and are electrically connected to the first body,
   second chips, which each contain a transistor and are arranged along a second axis parallel to the first axis on a second metallic body in a side-by-side and interspaced manner and are electrically connected to the second body,
   wherein the second chips, with regard to a third axis perpendicular to the first axis, each being arranged opposite an area of the first body, which is located between adjacent first chips,
   wherein the second chips each being electrically connected to the corresponding opposite area of the first body via at least one bonding connection,
   wherein the first chips, with regard to the third axis each being arranged opposite an area of the second body, which is located between adjacent second chips,
   a third metallic body being arranged on the second body so that it is electrically insulated and having projections, each of which being arranged on one of the areas of the second body, and
   wherein the first chips each being electrically connected to the opposite projection of the third body via at least one bonding connection.

2. Circuit arrangement according to claim 1, wherein
   the first body being connected to an output terminal,
   the second body being connected to a voltage terminal, and
   the third body being connected to a ground terminal.

3. Circuit arrangement according to claim 1, wherein
   the first chips without packaging being directly mounted on the first body in such a way that an electrical contact is created between the first chips and the first body, and
   the second chips without packaging being directly mounted on the second body in such a way that an electrical contact is created between the second chips and the second body.

4. Circuit arrangement according to claim 2, wherein
   the first chips without packaging being directly mounted on the first body in such a way that an electrical contact is created between the first chips and the first body, and
   the second chips without packaging being directly mounted on the second body in such a way that an electrical contact is created between the second chips and the second body.

5. Circuit arrangement according to claim 1, further comprising:
   a first control line running parallel to the first axis and being connected to the first chips via bonding connections,
   a second control line running parallel to the first axis and being connected to the second chips via bonding connections.

6. Circuit arrangement according to claim 2, further comprising:
   a first control line running parallel to the first axis and being connected to the first chips via bonding connections, a second control line running parallel to the first axis and being connected to the second chips via bonding connections.

7. Circuit arrangement according to claim 3, further comprising:
a first control line running parallel to the first axis and being connected to the first chips via bonding connections,
a second control line running parallel to the first axis and being connected to the second chips via bonding connections.

8. Circuit arrangement according to claim 4, further comprising:
a first control line running parallel to the first axis and being connected to the first chips via bonding connections,
a second control line running parallel to the first axis and being connected to the second chips via bonding connections.

9. Circuit arrangement comprising:
a first metallic body,
a second metallic body arranged coplanar with said first metallic body,
first chips, which each contain a transistor and are arranged along a first axis on the first metallic body and are electrically connected to the first body,
second chips, which each contain a transistor and are arranged along a second axis parallel to the first axis on the second metallic body and are electrically connected to the second body,
wherein the first and second chips are arranged alternative with respect to the first and second axis,
wherein the second chips each being electrically connected to a corresponding opposite area of the first body via at least one bonding connection,
a third metallic body being arranged on the second body so that it is electrically insulated and having projections, each of which being arranged between adjacent second chips, and
wherein the first chips each being electrically connected to the opposite projection of the third body via at least one bonding connection.

10. Circuit arrangement according to claim 9, wherein
the first body being connected to an output terminal,
the second body being connected to a voltage terminal, and
the third body being connected to a ground terminal.

11. Circuit arrangement according to claim 9, wherein
the first chips without packaging being directly mounted on the first body in such a way that an electrical contact is created between the first chips and the first body, and
the second chips without packaging being directly mounted on the second body in such a way that an electrical contact is created between the second chips and the second body.

12. Circuit arrangement according to claim 10, wherein
the first chips without packaging being directly mounted on the first body in such a way that an electrical contact is created between the first chips and the first body, and
the second chips without packaging being directly mounted on the second body in such a way that an electrical contact is created between the second chips and the second body.

13. Circuit arrangement according to claim 9, further comprising:
a first control line running parallel to the first axis and being connected to the first chips via bonding connections,
a second control line running parallel to the first axis and being connected to the second chips via bonding connections.

14. Circuit arrangement according to claim 10, further comprising:
a first control line running parallel to the first axis and being connected to the first chips via bonding connections,
a second control line running parallel to the first axis and being connected to the second chips via bonding connections.

15. Circuit arrangement according to claim 11, further comprising:
a first control line running parallel to the first axis and being connected to the first chips via bonding connections,
a second control line running parallel to the first axis and being connected to the second chips via bonding connections.

16. Circuit arrangement according to claim 12, further comprising:
a first control line running parallel to the first axis and being connected to the first chips via bonding connections,
a second control line running parallel to the first axis and being connected to the second chips via bonding connections.

* * * * *